United States Patent
Park et al.

(10) Patent No.: US 10,410,937 B2
(45) Date of Patent: Sep. 10, 2019

(54) OPTICAL MEASURING METHOD FOR SEMICONDUCTOR WAFER INCLUDING A PLURALITY OF PATTERNS AND METHOD OF MANUFACTURING SEMICONDUCTOR DEVICE USING OPTICAL MEASUREMENT

(71) Applicant: Samsung Electronics Co., Ltd., Suwon-si (KR)

(72) Inventors: Jang Ik Park, Suwon-si (KR); Bong Seok Kim, Seongnam-si (KR); Souk Kim, Seoul (KR); Yu Sin Yang, Seoul (KR); Soo Seok Lee, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/035,991

(22) Filed: Jul. 16, 2018

(65) Prior Publication Data

US 2019/0181062 A1 Jun. 13, 2019

(30) Foreign Application Priority Data

Dec. 8, 2017 (KR) .................. 10-2017-0168305

(51) Int. Cl.
*H01L 21/00* (2006.01)
*H01L 21/66* (2006.01)
(Continued)

(52) U.S. Cl.
CPC ........ *H01L 22/26* (2013.01); *H01L 21/76224* (2013.01); *H01L 21/78* (2013.01)

(58) Field of Classification Search
CPC .... H01L 22/26; H01L 21/76224; H01L 21/78
See application file for complete search history.

(56) References Cited

U.S. PATENT DOCUMENTS 5,131,752 A * 7/1992 Yu ................... G01B 11/0683
216/60
5,711,843 A * 1/1998 Jahns ................. B24B 37/013
156/345.24
(Continued)

FOREIGN PATENT DOCUMENTS

JP        5553716 B2    7/2014
JP     2014-146817 A   8/2014
(Continued)

*Primary Examiner* — Richard A Booth
(74) *Attorney, Agent, or Firm* — Muir Patent Law, PLLC

(57) ABSTRACT

A method of manufacturing a semiconductor device comprising: obtaining a raw light signal by selecting a predetermined wavelength band of light reflected from a wafer on which a plurality of patterns are formed; converting the raw light signal into a frequency domain; obtaining a first detection signal having a first frequency band from the raw light signal converted into the frequency domain; obtaining a second detection signal having a second frequency band from the raw light signal converted into the frequency domain, the second frequency band being different from the first frequency band; obtaining a representative value using the first detection signal, the representative value representing a profile of the plurality of patterns; and obtaining a distribution value using the second detection signal, the distribution value representing a profile of the plurality of patterns using the second detection signal. The method may include determining whether the representative value and the distribution value are within predetermined ranges respectively; and performing a following step of manufacturing the semiconductor device when the representative value and the distribution value are within respective predetermined ranges.

20 Claims, 15 Drawing Sheets

(51) Int. Cl.
*H01L 21/762* (2006.01)
*H01L 21/78* (2006.01)

(56) References Cited

U.S. PATENT DOCUMENTS

| | | | |
|---|---|---|---|
| 6,004,187 A | * | 12/1999 | Nyui .................. H01L 22/26 |
| | | | 257/E21.528 |
| 6,801,321 B1 | | 10/2004 | Du-Nour |
| 9,568,435 B2 | | 2/2017 | Vaez-Iravani et al. |
| 2003/0227607 A1 | | 12/2003 | Kato et al. |
| 2013/0329039 A1 | | 12/2013 | Sakai |
| 2016/0018340 A1 | | 1/2016 | Otani et al. |
| 2016/0116420 A1 | | 4/2016 | Duffy et al. |
| 2017/0023357 A1 | | 1/2017 | Turovets |

FOREIGN PATENT DOCUMENTS

| | | |
|---|---|---|
| JP | 2016-020867 A | 2/2016 |
| KR | 2003-0080181 A | 10/2003 |
| KR | 2016-0130848 A | 11/2016 |
| KR | 2017-0070218 A | 6/2017 |

\* cited by examiner

US 10,410,937 B2

OPTICAL MEASURING METHOD FOR SEMICONDUCTOR WAFER INCLUDING A PLURALITY OF PATTERNS AND METHOD OF MANUFACTURING SEMICONDUCTOR DEVICE USING OPTICAL MEASUREMENT

CROSS-REFERENCE TO RELATED APPLICATION

This application claims priority under 35 U.S.C. § 119 to Korean Patent Application No. 10-2017-0168305 filed on Dec. 8, 2017 in the Korean Intellectual Property Office, the disclosure of which is incorporated herein by reference in its entirety.

BACKGROUND

1. Field

The present inventive concept relates to an optical measuring method and a method of manufacturing a semiconductor device using an optical measurement method.

2. Description of Related Art

Semiconductor devices may be manufactured by applying various semiconductor manufacturing processes to wafers. As a degree of integration in a semiconductor device is increased, a large amount of research into a method of accurately measuring pattern structures formed on a wafer has been undertaken. For example, pattern structures formed on a wafer may be measured using a method, such as scanning, using a scanning electron microscope (SEM), a transmission electron microscope (TEM), and a virtual scanning electron microscope (VSEM), using an electron microscope. However, in the case of methods described above, there is a problem in which a specimen may be destroyed or measurement time may be increased during a process of measuring pattern structures.

SUMMARY

An aspect of the present inventive concept is to provide an optical measuring method of a semiconductor wafer, measuring pattern structures formed on a wafer at high speed, while a specimen is not destroyed.

According to an aspect of the present inventive concept, a method of manufacturing a semiconductor device includes obtaining a raw light signal by selecting a predetermined wavelength band of light reflected from a wafer on which a plurality of patterns are formed; converting the raw light signal into a frequency domain; obtaining a first detection signal having a first frequency band from the raw light signal converted into the frequency domain; obtaining a second detection signal having a second frequency band from the raw light signal converted into the frequency domain, the second frequency band being different from the first frequency band; obtaining a representative value using the first detection signal, the representative value representing a profile of the plurality of patterns; and obtaining a distribution value using the second detection signal, the distribution value representing a profile of the plurality of patterns using the second detection signal. The method may include determining whether the representative value and the distribution value are within predetermined ranges respectively; and performing a following step of manufacturing the semiconductor device when the representative value and the distribution value are within respective predetermined ranges.

According to an aspect of the present inventive concept, a method of manufacturing a semiconductor device includes obtaining a raw light signal defined in a frequency domain using light reflected from a measurement region including a plurality of patterns; dividing the raw light signal into a first detection signal having a first frequency band, a second detection signal having a second frequency band, and a third detection signal having a third frequency band; obtaining a representative value representing a profile of the plurality of patterns by converting the first detection signal into a wavelength domain; and obtaining a distribution value representing a profile of the plurality of patterns by inserting a value of the second detection signal into a matching function provided in advance. The method may include determining whether the representative value and the distribution value are within predetermined ranges respectively; and performing a following step of manufacturing the semiconductor device when the representative value and the distribution value are within respective predetermined ranges.

According to an aspect of the present inventive concept, a method of manufacturing a semiconductor device includes generating first simulation signals by selecting a predetermined wavelength band of light reflected from each of a plurality of sample regions, each of the plurality of sample regions including a plurality of sample patterns; obtaining second simulation signals by converting the first simulation signals into a frequency domain and selecting a predetermined frequency band; generating a matching function defining a relationship between root mean square values of the second simulation signals and distribution values of dimensional parameters determining profiles of the plurality of sample patterns; generating a raw light signal by selecting the wavelength band from light reflected from a measurement region including a plurality of patterns; obtaining a detection signal by converting the raw light signal into a frequency domain and selecting the predetermined frequency band; and calculating the distribution value of the dimensional parameters determining profiles of the plurality of patterns by inserting a root mean square value of the detection signal into the matching function. The method may include determining whether the distribution value is within a predetermined range; and performing a following step of manufacturing the semiconductor device when the distribution value is within a predetermined range, wherein the following step may be a layer deposition step or a dicing step.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
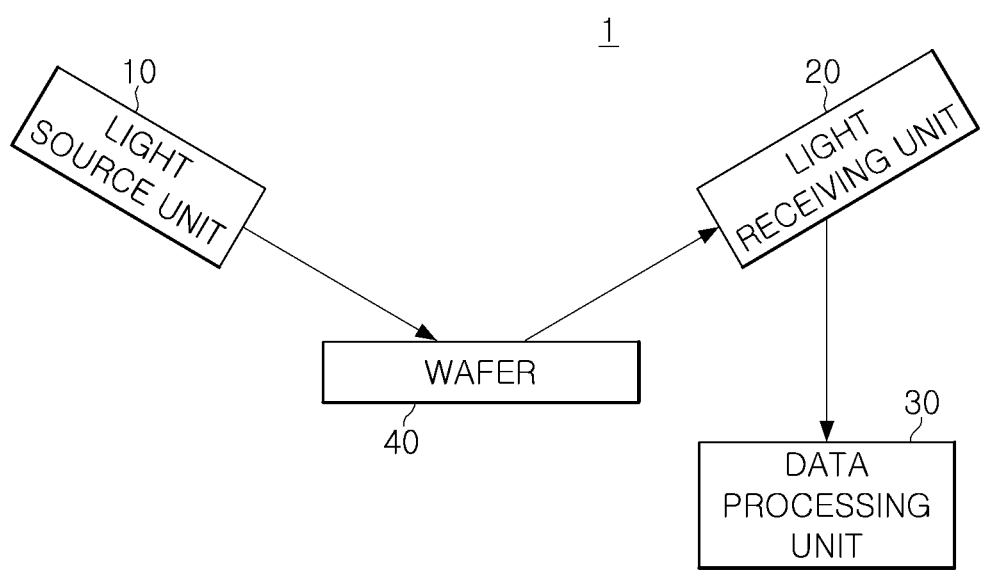
FIG. 1 is a view illustrating an optical measuring method using a measuring device according to an example embodiment.

FIG. 1 is a view illustrating an optical measuring method using a measuring device according to an example embodiment.

With reference to FIG. 1, a measuring device 1 according to an example embodiment may include a light source unit 10, a light receiving unit 20, a data processing unit 30, or the like. The measuring device 1 may measure a thickness of a layer formed on a wafer 40 or a profile of a plurality of patterns formed on the wafer 40 using a non-destructive optical measuring method not damaging the wafer 40. The profile of patterns may be determined by dimensional parameters, such as a width, an interval, a height, a thickness, and a length, defining a structure and a form of the patterns, or the like.

The wafer 40 may include a substrate and one or more layers formed on the substrate. Layers described above may include a semiconductor material, a conductive material, an insulating material, a photoresist, or the like. In an example embodiment, a pattern having a repeated structure may be formed on the wafer 40.

The measuring device 1 may irradiate light onto the wafer 40 using the light source unit 10, and the light receiving unit 20 may receive light reflected from the wafer 40, thereby generating optical spectrum information. In an example embodiment, the light source unit 10 and the light receiving unit 20 may form a spectroscopic ellipsometer (SE). For example, the light source unit 10 may include a light source, such a laser (to provide monochromatic light) or a spectrum of light, and a polarizer. The light receiving unit 20 may include a light detector (e.g., one or more photodiodes) which receives reflected light after passing through a polarizer of the light receiving unit 20. The data processing unit 30 may comprise a computer (e.g., one or more central processing units (CPU(s)) configured by software). The data processing unit 30 may generate a raw light signal by selecting a predetermined light wavelength band from the optical spectrum information. In addition, the data processing unit 30 may remove noise from the raw light signal and perform a process of extracting only necessary signal components, thereby measuring a thickness of a layer included in the wafer 40 or calculating values representing the profile of a plurality of patterns formed on the wafer 40.

In an example embodiment, the data processing unit 30 may calculate the thickness of the layer included in the wafer 40, or may calculate the values representing the profile of the plurality of patterns included in the wafer 40. The values representing the profile of the plurality of patterns included in the wafer 40 may include a representative value and a distribution value of least one of dimensional parameters determining the profile of the plurality of patterns. For example, in a case in which the profiles of the patterns formed on the wafer 40 are inspected, the data processing unit 30 may calculate an average value or a median value of at least one of dimensional parameters, such as a width, an interval, a height, or the like, of the patterns as the representative value and may calculate a distributed variation (e.g., a variance) or a standard deviation of at least one of the dimensional parameters as the distribution value.

Figure 2:
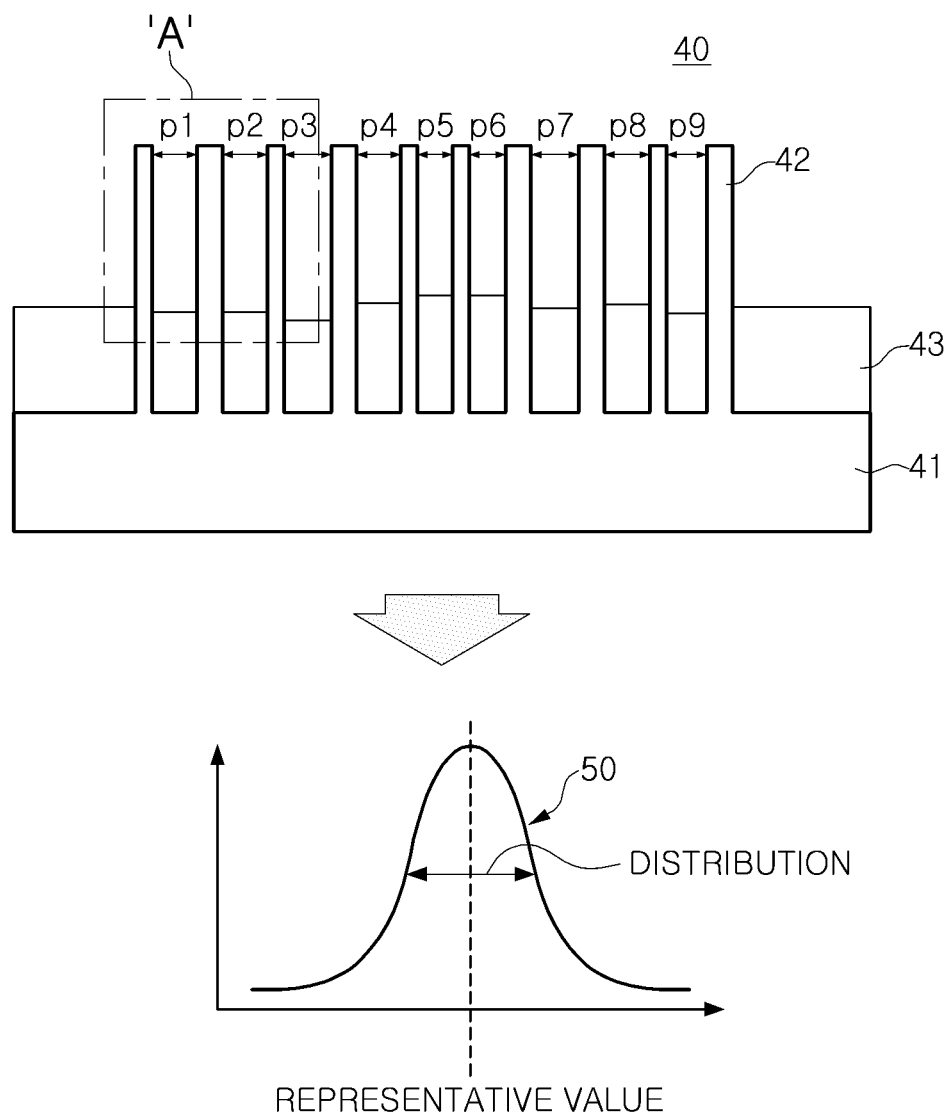
FIG. 2 is a schematic view of a semiconductor device to which an optical measuring method according to an example embodiment may be applied and a view of a measurement result.

FIG. 2 shows a schematic view of a wafer to which an optical measuring method according to an example embodiment may be applied and a view of a measurement result.

With reference to FIG. 2, a wafer 40 may include a substrate 41, a plurality of patterns 42 formed on the substrate 41, a layer 43 formed on the substrate 41, or the like. In an example embodiment, the substrate 41 may include a semiconductor material, such as silicon (Si), while the plurality of patterns 42 may include a fin structure formed by etching a portion of the substrate 41. For example, the layer 43 formed on the substrate 41 may be provided as a device isolation layer filling a portion of a space between the plurality of patterns 42.

A measuring device may calculate a representative value and a distribution value, representing a profile of the plurality of patterns 42 using light reflected by the wafer 40. In an example embodiment, the measuring device may calculate each of an average value and a standard deviation of intervals p1 to p9 between the plurality of patterns 42 as the representative value and the distribution value, representing the profile of a plurality of patterns. With reference to FIG. 2, the measuring device may calculate the representative value and the distribution value to calculate a distribution curve 50 of the intervals p1 to p9 between the plurality of patterns 42. A task manager may determine whether the plurality of patterns 42 are formed to have an appropriate profile in consideration of the representative value, the distribution value, the distribution curve 50, or the like, which are output by the measuring device.

Figure 3:
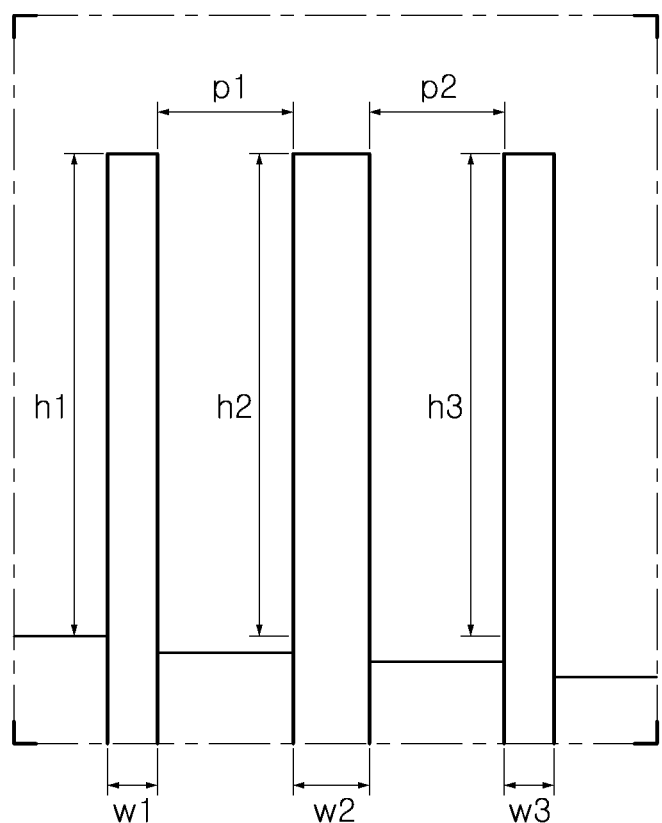
FIG. 3 is an enlarged view of a portion of a semiconductor device according to an example embodiment, illustrated in FIG. 2.

FIG. 3 is an enlarged view of region 'A' of a wafer 40 illustrated in FIG. 2. With reference to FIG. 3, a profile of a plurality of patterns 42 formed to have a fin structure may be determined by dimensional parameters of each of the plurality of patterns 42. In an example embodiment, the dimensional parameters determining the profile of each of the plurality of patterns 42 may include widths w1 to w3, intervals p1 to p2, heights h1 to h3, or the like, of each of the plurality of patterns 42.

The measuring device according to an example embodiment may calculate a representative value and a distribution value of at least one of the dimensional parameters determining the profile of the plurality of patterns 42. Thus, after a process of forming the plurality of patterns 42 is performed, the task manager may predict the profile of the plurality of patterns 42 in consideration of the representative value and the distribution value provided by the measuring device.

Figure 4:
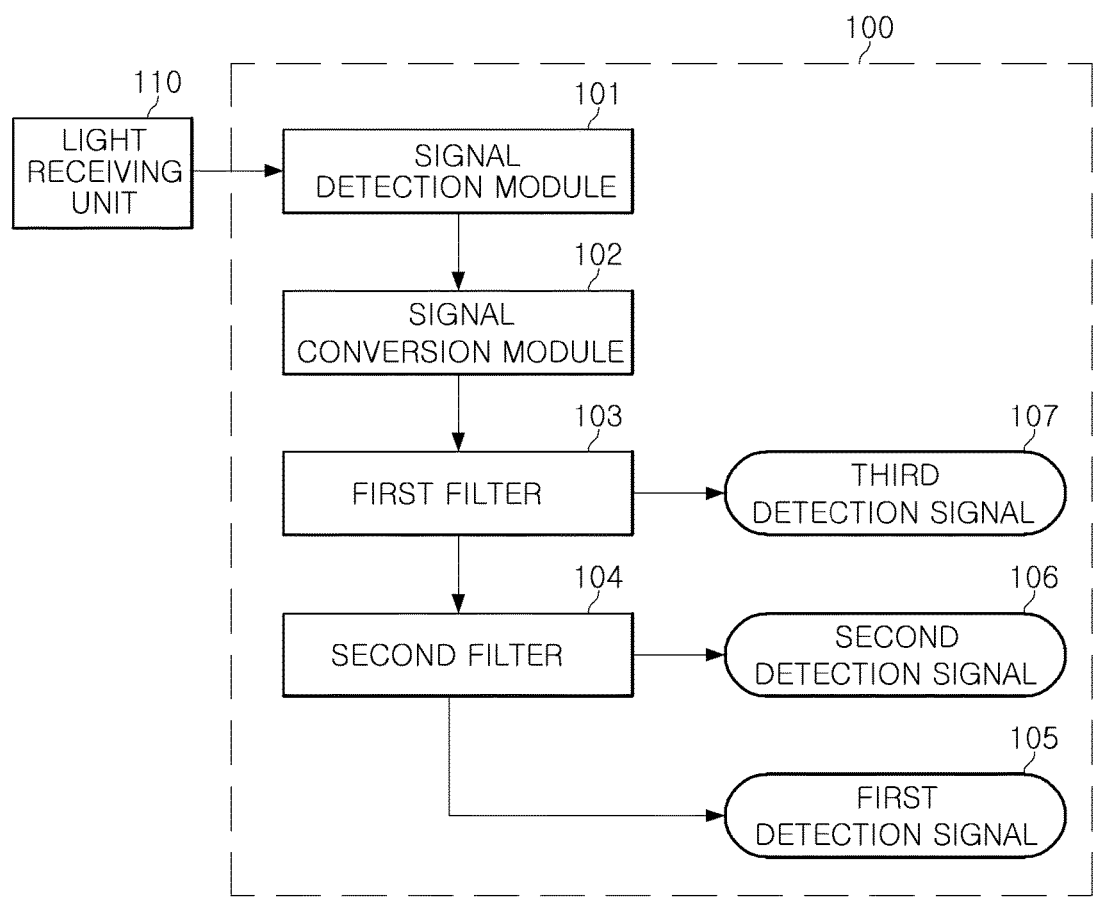
FIG. 4 is a schematic block diagram of a measuring device according to an example embodiment.

FIG. 4 is a schematic block diagram of a measuring device according to an example embodiment.

With reference to FIG. 4, the measuring device according to an example embodiment may include a data processing unit 100 and a light receiving unit 110. The data processing unit 100 may be the same as the data processing unit 30 in FIG. 1 and the light receiving unit 110 may be the same as the light receiving unit 20 in FIG. 1. The light receiving unit 110 may receive light reflected by a wafer to generate optical spectrum information. For example, the light receiving unit 110 may generate first and second light intensity values (or amplitude values) for first and second polarization directions (that are perpendicular to each other) of reflected light from the wafer 40 for each of a plurality of discrete wavelengths over a selected optical spectrum to generate optical spectrum information. The optical spectrum information may be transmitted to the data processing unit 100. The data processing unit 100 may include a signal detection module 101, a signal conversion module 102, a first filter 103, a second filter 104, and the like.

Figure 8:
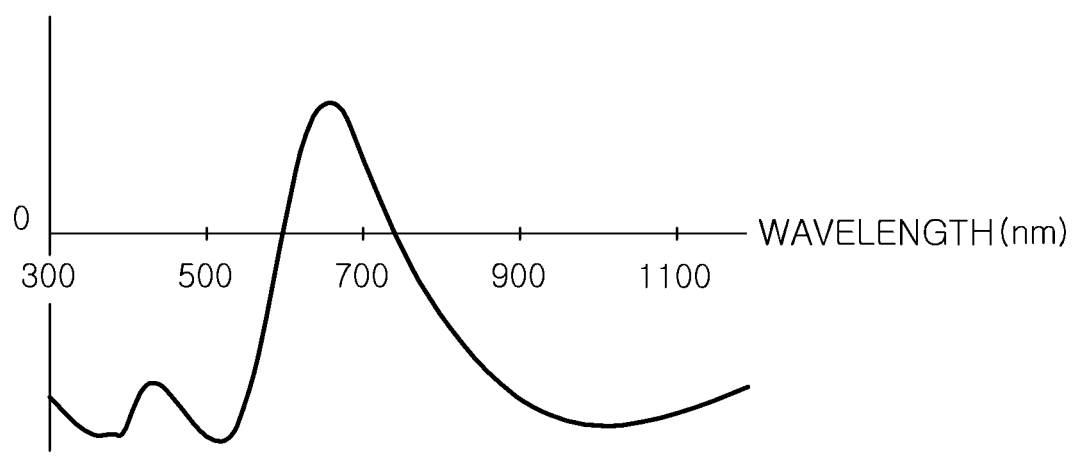
FIGS. 8 to 11 are graphs illustrating an optical measuring method according to an example embodiment.
Figure 9:
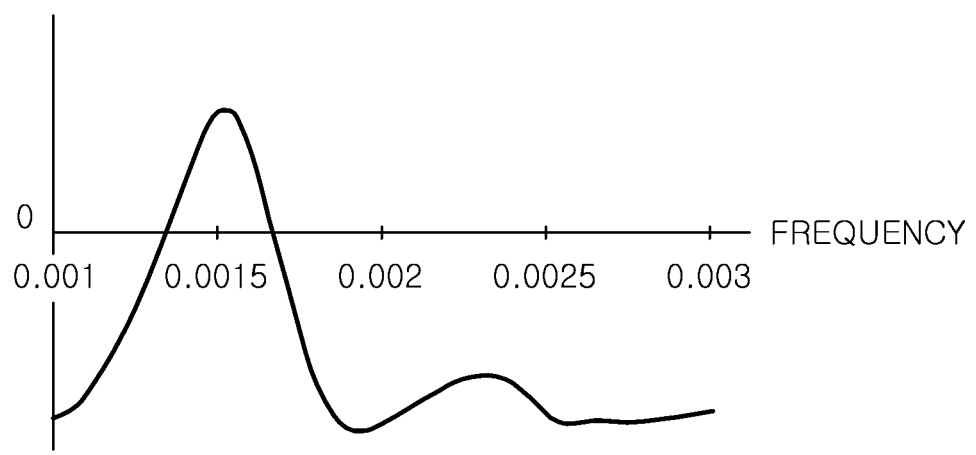

The signal detection module 101 may generate a raw light signal using the optical spectrum information of light transmitted by the light receiving unit 110. In an example embodiment, the signal detection module 101 may select a predetermined wavelength band in a reflectance spectrum or a phase difference spectrum according to a wavelength of light reflected by the wafer to generate the raw light signal. For example, the raw light signal may be provided as a function representing light intensity or phase difference with respect to wavelength, such as with respect to wavelength in a selected wavelength band (e.g., 200 nm to 1300 nm). For example, the raw light signal may be a function denoting a ratio of light intensity/amplitude (e.g., of the first and second light intensity values (or amplitude values) of the reflected light in the first and second polarization directions) with respect to wavelength. For example, the raw light signal may be a function denoting a phase difference (e.g., of the reflected light in the first and second polarization directions) with respect to wavelength. FIG. 8 shows one example of a raw light signal.

The signal conversion module 102 may convert the raw light signal into a frequency domain. For example, the curve of the raw light signal may be represented by a plurality of different frequency components (e.g., the summation of a plurality of sinusoidal waves of different frequencies). For example, the function of the raw light signal may be subjected to a fast Fourier transform (FFT) to obtain such different frequency components. The raw light signal converted into the frequency domain by the signal conversion module 102 may be divided into a first detection signal, a second detection signal, and a third detection signal by the first filter 103 and the second filter 104. The data processing unit 100 may calculate a representative value and a distribution value, representing a profile of a plurality of patterns formed on a wafer using at least a portion of the first detection signal, the second detection signal, and the third detection signal. For example, at least one of the first, second and third detection signals may be used to produce the representative value and/or the distribution value in the data processing unit 100.

In an example embodiment, the first filter 103 may be provided as a high pass filter filtering a high frequency band of the raw light signal converted into the frequency domain. For example, the first filter 103 may be configured to gather high frequency band information from the frequency domain, and to pass the other frequency information of the frequency domain. For example, the first filter 103 may be configured to filter a higher frequency band including higher frequencies of the raw light signal converted into frequency domain and to pass a lower frequency band including lower frequencies of the raw light signal converted into frequency domain. The second filter 104 may be provided as a band pass filter filtering an intermediate frequency band of the raw light signal converted into the frequency domain. For example, the second filter 104 may be configured to gather an intermediate frequency band information from the frequency domain and to pass the other frequency information of the frequency domain coming from the first filter 103. For example, the first filter 103 and the second filter 104 may be implemented to be a moving average filter, a fast Fourier transform (FFT) filter, or the like.

In an example embodiment, a signal component of a low frequency band not filtered by (e.g., passed through) the first filter 103 and the second filter 104 may be defined as a first detection signal 105. The signal component of the intermediate frequency band filtered and/or gathered by the second filter 104 may be defined as a second detection signal 106, while the signal component of the high frequency band filtered and/or gathered by the first filter 103 may be defined as a third detection signal 107. For example, the signal component of the low frequency band may comprise one or more frequency components of the curve of the raw light signal below a first frequency (or several frequency components within a range of frequencies below the first frequency). For example, the signal component of the intermediate frequency band may comprise one or more frequency components of the curve of the raw light signal between the first frequency and a higher second frequency (or several frequency components within a range of frequencies between the first and second frequencies). For example, one or more frequency components of the low frequency band may represent a median value or an average value of a dimensional parameter of a pattern (e.g., a repeating pattern) or a layer, and one or more frequency components of the intermediate frequency band may represent a distribution value (e.g., standard deviation, variance or another value representing distribution) of a dimensional parameter of a pattern (e.g., a repeating pattern) or a layer. The data processing unit 100 may determine the third detection signal 107 corresponding to a high frequency component as being a noise component. For example, the third detection signal 107 may be provided as a noise component generated in a process of processing a signal in the data processing unit 100. The third detection signal 107 may be removed using the first filter 103, thereby calculating a representative value and a distribution value, representing the profile of the plurality of patterns formed on the wafer, in more detail or more precisely. After the data processing unit 100 determines the third detection signal 107 as the noise component to remove the third detection signal 107, the data processing unit 100 may calculate the representative value representing the profile of the plurality of patterns using the first detection signal 105 and may calculate the distribution value representing the profile of the plurality of patterns using the second detection signal 106.

Figure 5:
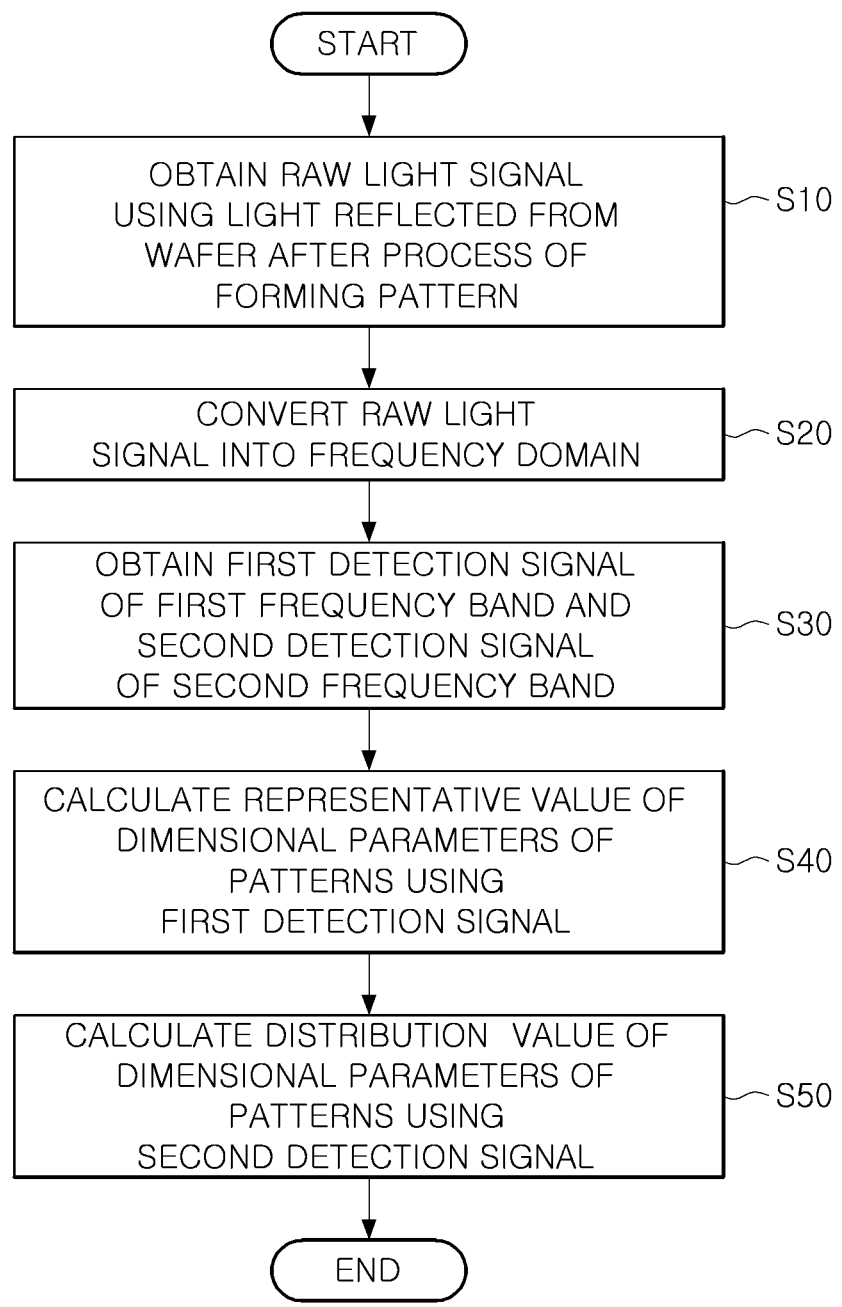
FIGS. 5 to 7 are flowcharts illustrating an optical measuring method according to an example embodiment.
Figure 6:
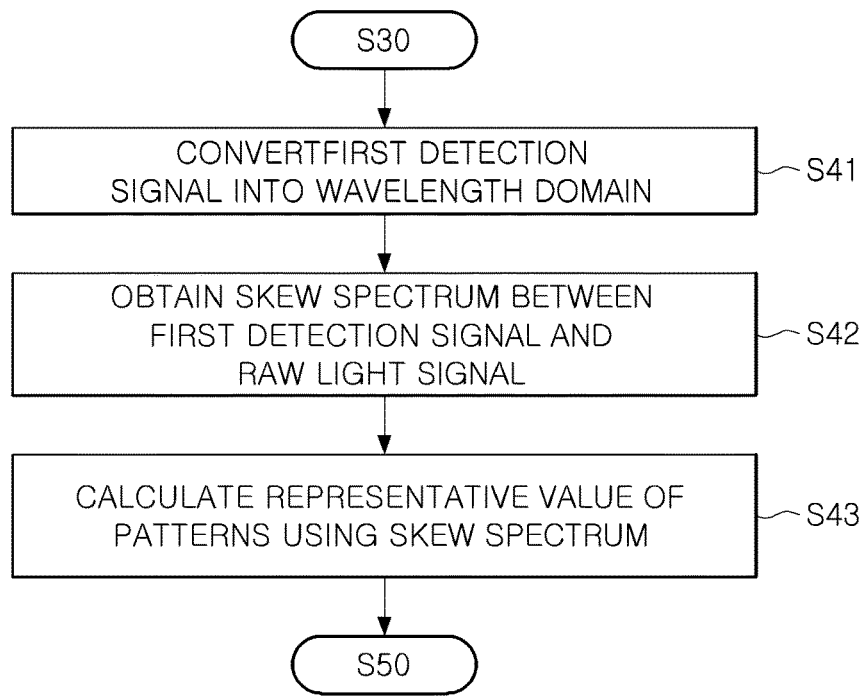
Figure 7:
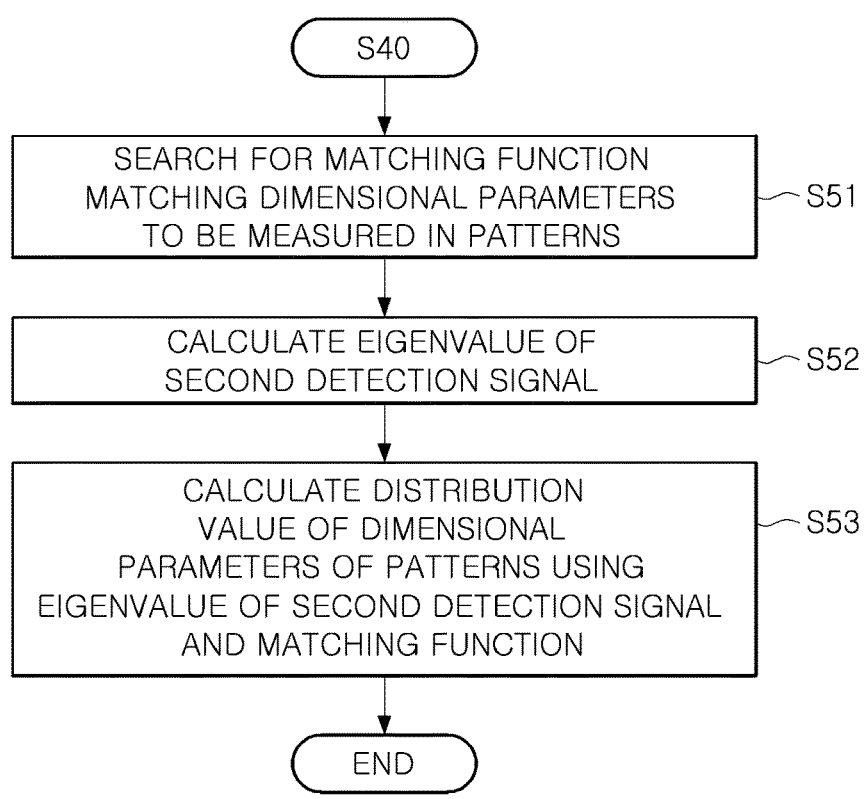

FIGS. 5 to 7 are flowcharts illustrating an optical measuring method according to an example embodiment.

First, with reference to FIG. 5, an optical measuring method according to an example embodiment may be started in such a manner that a measuring device obtains a raw light signal using light reflected from a wafer on which a plurality of patterns are formed in S10. In a case in which the plurality of patterns are formed on the wafer, the measuring device may obtain the raw light signal by selecting only a predetermined wavelength band from an optical spectrum distribution of light reflected by the wafer. The raw light signal may be defined in a wavelength domain, while a measuring device may convert the raw light signal into a frequency domain in S20.

The measuring device may select a signal component of a first frequency band from the raw light signal converted into the frequency domain to obtain a first detection signal and may select a signal component of a second frequency band to obtain a second detection signal in S30. The first frequency band may be lower than the second frequency band. In an example embodiment, the measuring device may filter the raw light signal converted into the frequency domain using a low pass filter and a band pass filter, thereby obtaining the first detection signal and the second detection signal. In order to increase accuracy of measurement, a process of filtering the raw light signal converted into the frequency domain using a high pass filter may be further provided. The high pass filter may remove a noise component in a high frequency band.

The measuring device may calculate a representative value of at least one of dimensional parameters determining a profile of the plurality of patterns formed on the wafer using the first detection signal in S40. Next, the measuring device may calculate a distribution value of at least one of the dimensional parameters of the plurality of patterns formed on the wafer using the second detection signal in S50. Hereinafter, with reference to FIGS. 5 and 6, a method of calculating each of the representative value and the distribution value of the dimensional parameters of the plurality of patterns will be described in detail.

With reference to FIG. 6, the measuring device may convert the first detection signal of the frequency domain into the wavelength domain in S41. As described above, the measuring device may detect the first detection signal corresponding to the first frequency band after converting the raw light signal including the optical spectrum distribution of light reflected by the wafer into the frequency domain. The measuring device may convert the first detection signal from the frequency domain into the wavelength domain, in order to calculate a representative value of at least one of the dimensional parameters determining the profile of the plurality of patterns.

The measuring device may obtain a skew spectrum, converted into the wavelength domain, between the first detection signal and the raw light signal in S42. Since, in the frequency domain, the second detection signal and the third detection signal are selectively removed from the raw light signal to generate the first detection signal, the first detection signal may not entirely match the raw light signal. The measuring device may calculate a representative value of at least one of the dimensional parameters determining the profile of the plurality of patterns, such as a width, a length, a height, an interval, and a thickness of the plurality of patterns, using the skew spectrum obtained in S42, in S43.

According to various example embodiments, S41, S42, and S43 may be substituted with other processes. In an example embodiment, an FFT may be applied to the first detection signal of the frequency domain to convert the first detection signal into a signal of a thickness domain, and a peak value may be found in the signal of the thickness domain to measure a representative value of a thickness of the plurality of patterns. For example, the Cooley-Tukey algorithm or the Prime Factor algorithm may be applied to the first detection signal of the frequency domain, thereby converting the first detection signal into the signal of the thickness domain. Alternatively, a predetermined modeling technique, such as rigorous coupled-wave analysis (RCWA), may be applied to the first detection signal of the wavelength domain, thereby measuring a representative value of at least one of the dimensional parameters of the plurality of patterns.

Subsequently, with reference to FIG. 7, the measuring device may search for a matching function matching a distribution value of the dimensional parameters to be measured in the plurality of patterns in S51. As described above, the measuring device according to an example embodiment may calculate the distribution value of various dimensional parameters, such as the width, the interval, the length, the height, the depth, and an inclination angle of a side wall, determining the profile of the plurality of patterns. The measuring device may select dimensional parameters to measure the distribution value among the dimensional parameters and may select a matching function of the dimensional parameters having been selected.

The measuring device may calculate an eigenvalue of the second detection signal in S52. In an example embodiment, the eigenvalue may be provided as a value obtained in such a manner that the measuring device applies a predetermined function to the second detection signal. For example, the predetermined function may be provided as a function calculating a root mean square from the second detection signal. For example, the measuring device may calculate a root mean square value of the second detection signal to determine the eigenvalue.

The eigenvalue calculated from the second detection signal may have a unit having no relationship with the distribution value representing distribution of the dimensional parameters determining the profile of the plurality of patterns. The matching function may be provided as a function defining a relationship between the eigenvalue calculated from the second detection signal and the distribution value of the dimensional parameters. Therefore, the measuring device may calculate the distribution value of the dimensional parameters of the plurality of patterns using the eigenvalue of the second detection signal and the matching function.

The matching function may be obtained through a plurality of simulations. For example, the plurality of simulations may be performed before an actual measurement of a wafer is performed, and then the wafer may be presented to the measuring device 1 to measure the representative value and the distribution value of a pattern formed on the wafer. In an example embodiment, to obtain matching functions, the measuring device may select a predetermined wavelength band of light reflected by each of a plurality of sample patterns having different structures, thereby obtaining first simulation signals. The measuring device may convert the first simulation signals into the frequency domain and select only the signal component of an intermediate frequency band, thereby obtaining second simulation signals. The measuring device may define the matching function using the relationship between the eigenvalues of the second simulation signals, for example, between the root mean square values and actual distribution values of the dimensional parameters measured in the plurality of sample patterns.

FIGS. 8 to 11 are graphs illustrating an optical measuring method according to an example embodiment. For example, graphs illustrated in FIGS. 8 to 11 may be graphs illustrating signals having a spectral form.

FIG. 8 may be an example of a raw light signal obtained using light reflected from a wafer by a measuring device. The measuring device may select only a predetermined wavelength band of light reflected by the wafer, thereby obtaining the raw light signal as illustrated in FIG. 8. The measuring device may convert the raw light signal from a wavelength domain into a frequency domain (1/a wavelength domain). In an example embodiment, the raw light signal converted into the frequency domain may be the same as that illustrated in FIG. 9.

Figure 10A:
Figure 10B:
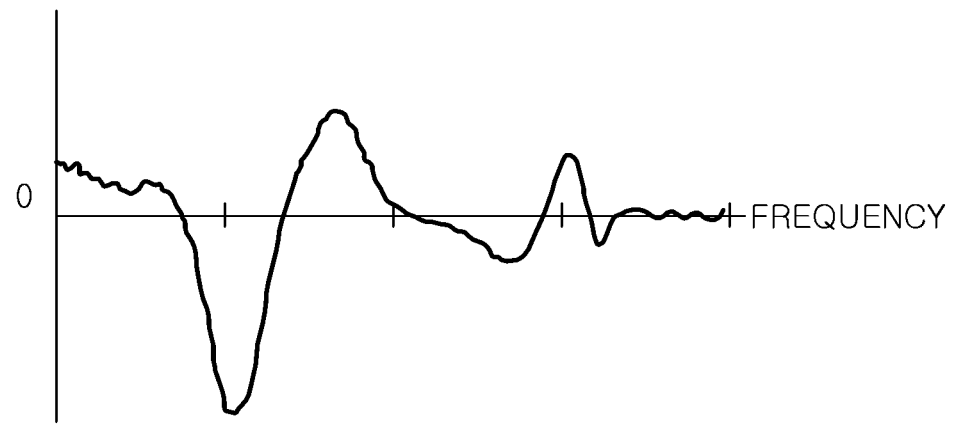
Figure 10C:
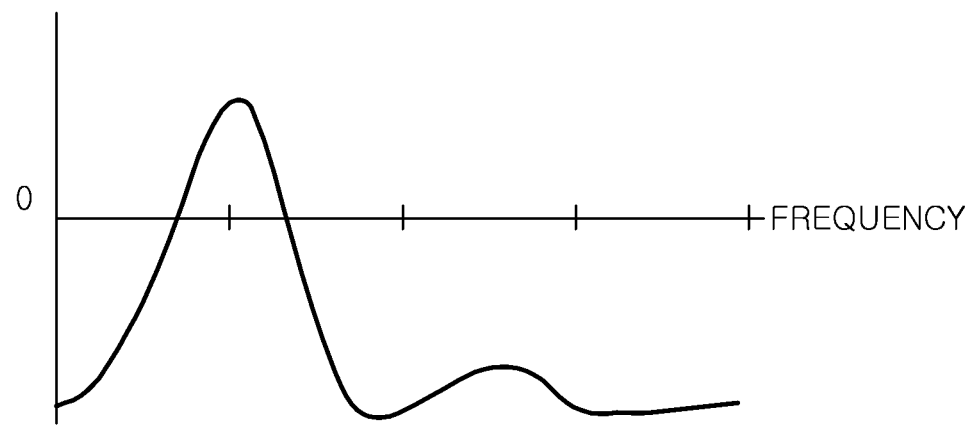

FIGS. 10A, 10B and 10C may be graphs respectfully illustrating a first detection signal, a second detection signal and a third detection signal, generated by filtering the raw light signal converted into the frequency domain, e.g., by the measuring device illustrated in FIG. 4. For example, FIG. 10A may be a graph of the third detection signal generated by selecting only a high frequency band component of the raw light signal in the frequency domain. The third detection signal may be construed as being a noise component generated in a process of operating the measuring device and may be excluded from a subsequent arithmetic process.

FIG. 10B may be a graph of the second detection signal generated by selecting only an intermediate frequency band component of the raw light signal in the frequency domain. The measuring device may calculate/obtain a distribution value of dimensional parameters determining a profile of a plurality of patterns formed on the wafer using the second detection signal. As described above, the measuring device may store a matching function obtained through a simulation process before the distribution value of the dimensional parameters of the plurality of patterns are calculated. For example, the measuring device may use the stored matching function to obtain the distribution value of the dimensional parameters. The matching function may be provided as a function representing a relationship between eigenvalues of second simulation signals obtained from a plurality of sample patterns and actual distribution values of the dimensional parameters measured in the plurality of sample patterns in the simulation process. For example, the eigenvalues of the second simulation signals may respectively match with actual distribution values of the dimensional parameters of the sample patterns.

The second simulation signal may be provided as a signal obtained by the measuring device in the same manner as that of the second detection signal. For example, the measuring device may convert a first simulation signal generated from light reflected from each of the plurality of sample patterns into the frequency domain and select only the intermediate frequency band, thereby generating the second simulation signal. In an example embodiment, the eigenvalue of the second simulation signal may be provided as a root mean square value of the second simulation signal. The measuring device may insert the eigenvalue of the second detection signal into the matching function, thereby obtaining the distribution value of the dimensional parameters of the plurality of patterns formed on the wafer. For example, the measuring device may substitute a term of the matching function with a value related to the second detection signal to obtain the distribution value of the dimensional parameters of the plurality of patterns formed on the wafer.

FIG. 10C may be a first detection signal generated by selecting only a low frequency band component of the raw light signal of the frequency domain. The measuring device may calculate a representative value of the dimensional parameters of the plurality of patterns formed on the wafer using the first detection signal. For example, the measuring device may apply an FFT to the first detection signal in the frequency domain as illustrated in FIG. 10C, thereby obtaining a result spectrum and measuring a thickness of the plurality of patterns from the result spectrum.

Figure 11:
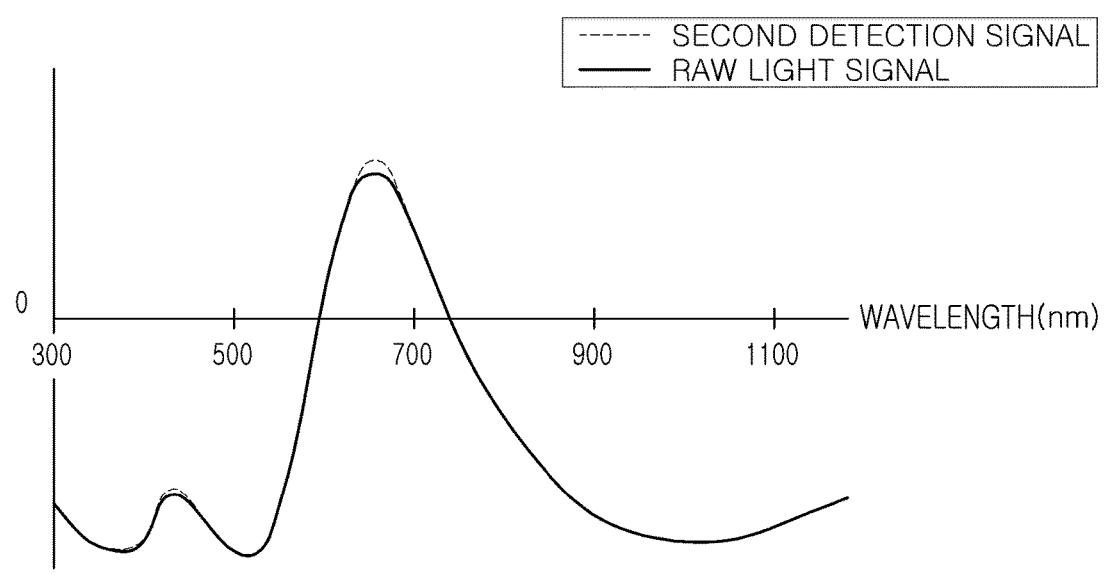

As illustrated in FIG. 11, the measuring device according to an example embodiment may calculate the representative value of the dimensional parameters of the plurality of patterns using the first detection signal in the wavelength domain. With reference to FIG. 11, since components of the intermediate frequency band and the high frequency band are removed from the raw light signal to generate the first detection signal, the first detection signal may be different from the raw light signal in a portion of a wavelength band. In an example embodiment, signal components having less influence on the representative value of the plurality of patterns may be removed from the raw light signal, and the representative value may be calculated based only on the first detection signal, thereby implementing a more accurate measuring method. As described above, the representative value calculated using the first detection signal may be a median value or an average value of any one of the dimensional parameters, such as a line width, a length, a height, a depth, and an interval, representing the profile of the plurality of patterns.

Figure 12:
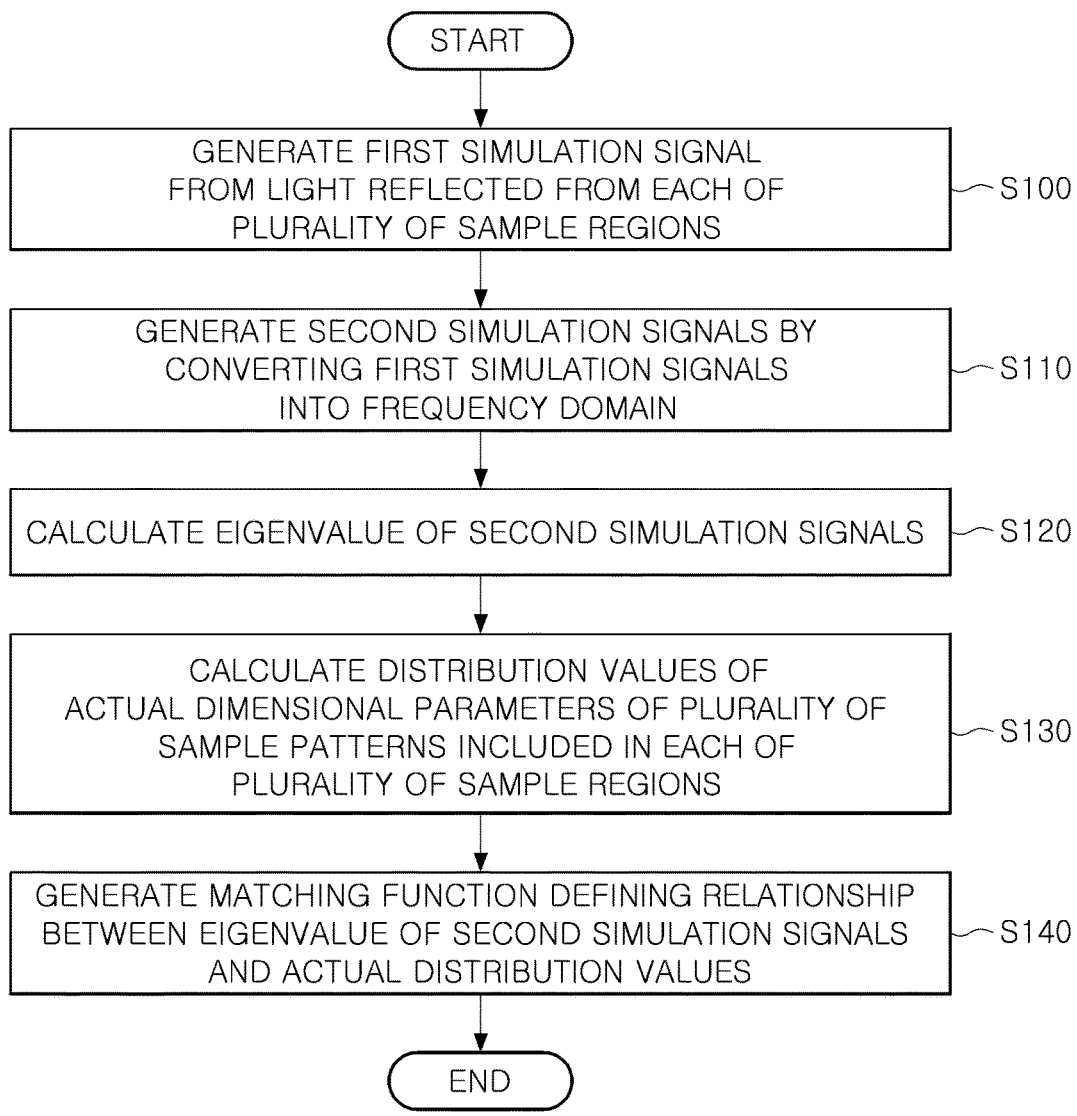
FIG. 12 is a flowchart illustrating an optical measuring method according to an example embodiment.

FIG. 12 is a flowchart illustrating an optical measuring method according to an example embodiment.

As described above, in an example embodiment, a second detection signal may be produced from an intermediate frequency band of a raw light signal obtained from light reflected by a wafer and a distribution value of dimensional parameters may be produced by calculating an eigenvalue of the second detection signal to determine a profile of a plurality of patterns formed on the wafer. In order to calculate the distribution value using the eigenvalue of the second detection signal, a matching function may be generated in advance, in which the matching function defines a relationship between the eigenvalue of the intermediate frequency band of the raw light signal obtained from light reflected from the plurality of patterns and the distribution value of the dimensional parameters of the plurality of patterns.

With reference to FIG. 12, a process of generating the matching function may be started in such a manner that a measuring device generates first simulation signals from light reflected from each of a plurality of sample regions in S100. Each of the plurality of sample regions may have a plurality of sample patterns, while the plurality of sample patterns may have different profiles. A first simulation signal may be generated by selecting a predetermined light wavelength band in an optical spectrum of light reflected from the plurality of sample patterns.

The measuring device may convert the first simulation signal into a frequency domain (1/a wavelength domain) and select the predetermined intermediate frequency band from the first simulation signal of the frequency domain, thereby generating a second simulation signal in S110. Since the second simulation signal is generated from each of the first simulation signals generated from the plurality of sample regions, the measuring device may obtain a plurality of second simulation signals from the plurality of sample regions.

The measuring device may calculate respective eigenvalues of second simulation signals in S120. The eigenvalues calculated in S120 may be provided as a root mean square value calculated from each of the second simulation signals. The measuring device may calculate actual distribution values using the dimensional parameters determining the profile of the plurality of sample patterns in S130. For example, distribution values of dimensional parameters of the plurality of sample patterns in each sample regions may be produced in S130.

In an example embodiment, actual distribution values of the plurality of sample patterns may be calculated using a simulation process, while the plurality of sample patterns are not actually manufactured. For example, in the simulation process, the actual distribution values of the dimensional parameters may be calculated by changing at least one value among a width, a length, an interval, a height, a depth, and/or the like, of sample patterns which are parameters determining the profile of the plurality of sample patterns. The measuring device may generate the matching function defining a relationship between an eigenvalue of the second simulation signals calculated in S120 and the actual distribution values in S140. In an example embodiment, the matching function may be defined such that the actual distribution value and the eigenvalue of the second simulation signals have a relationship of an n-th order function.

Figure 13:
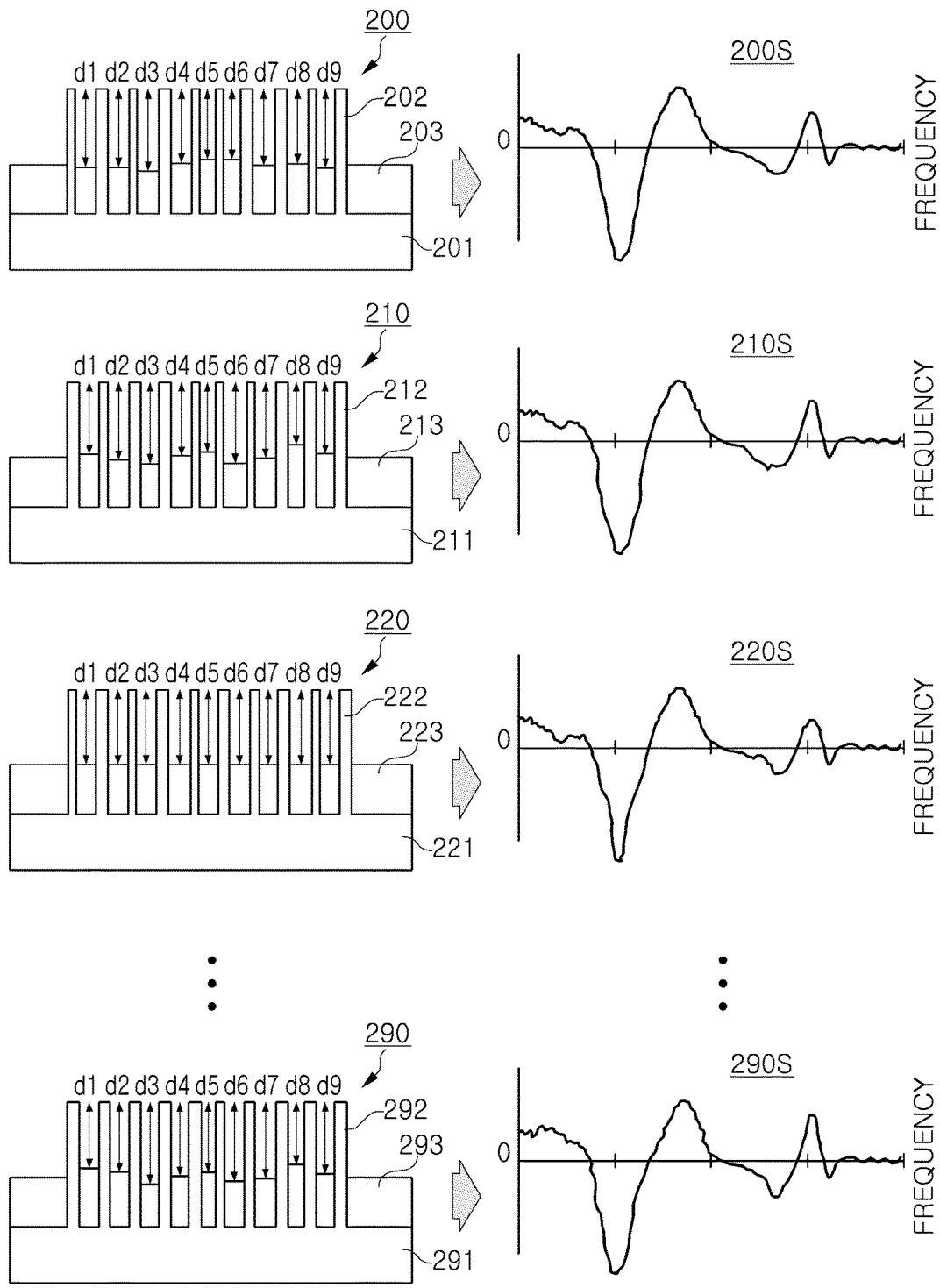
FIGS. 13 and 14 are graphs illustrating a method of generating a matching function in an optical measuring method according to an example embodiment.
Figure 14:
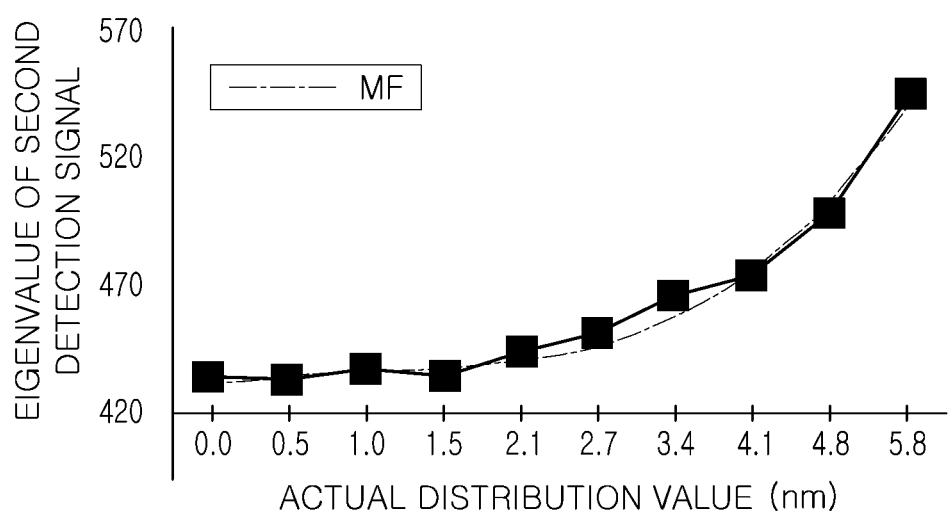

FIGS. 13 and 14 are graphs illustrating a method of generating a matching function in an optical measuring method according to an example embodiment.

First, with reference to FIG. 13, a plurality of sample regions 200 to 290 may be provided. The plurality of sample regions 200 to 290 may have the same structure. For example, in a case in which a first sample region 200 is described as an example, the first sample region 200 may include a substrate 201, a plurality of first sample patterns 202, a device isolation layer 203, and the like.

However, a plurality of sample patterns 202 to 292 included in each of the plurality of sample regions 200 to 290 may have different profiles. For example, with reference to FIG. 13, heights d1 to d9 of a plurality of first sample patterns 202 and heights d1 to d9 of a plurality of second sample patterns 212 may have different distributions. Thus, the plurality of first sample patterns 202 and the plurality of second sample patterns 212 may have different profiles.

With reference to FIG. 13, second simulation signals 200S to 290S may be generated using light reflected by each of the plurality of sample patterns 202 to 292. The second simulation signals 200S to 290S may be generated in such a manner that a predetermined wavelength band is selected from an optical spectrum of light reflected by each of the plurality of sample patterns 202 to 292 to generate a first simulation signal, and only an intermediate frequency band is selected from the first simulation signal. The second simulation signals 200S to 290S may have similar trends, but may not be identical to each other, depending on a profile difference of the plurality of sample patterns 202 to 292.

A measuring device may generate the matching function in such a manner that an eigenvalue of each of the second simulation signals 200S to 290S is calculated and mapped with an actual distribution value calculated from dimensional parameters of the plurality of sample patterns 202 to 292. With reference to FIG. 14, a relationship between the actual distribution value calculated from the plurality of sample patterns 202 to 292 and the eigenvalue obtained from the second simulation signals 200S to 290S may be defined by a matching function MF. For example, the matching function MF may be produced from the actual distribution data of the sample patterns 202-292 and the eigenvalues of the second simulation signals 200S-290S, and may represent a relationship between the distribution data and the eigenvalues. In an example embodiment, the matching function MF may be generated as an n-th order function in such a manner that a graph is defined by assigning the actual distribution value and the eigenvalue to axes intersecting each other, and a slope and an offset value of the graph are calculated. For example, the matching function MF may be obtained by matching an n-th order function to a graph plotting eigenvalues with respect to corresponding actual distribution values on a Cartesian coordinate system in a plane comprising two axis respectively representing the eigenvalues in a vertical axis and the actual distribution values in a horizontal axis as shown in FIG. 14.

When the distribution value of dimensional parameters determining the profile of a plurality of patterns in a wafer on which the plurality of patterns are formed is calculated, the measuring device may obtain the distribution value of the dimensional parameters of the plurality of patterns by inserting the eigenvalue of the second detection signal obtained from light reflected by the plurality of patterns into the matching function MF. Alternatively, the distribution value of the dimensional parameters of the plurality of patterns may be obtained using the slope and the offset value, defining the matching function MF. Even in the case in which the eigenvalue of the second detection signal is not covered by sample patterns used to obtain the matching function MF illustrated in FIG. 14, the distribution value may be calculated by using the slope and the offset value. For example, even though an eigenvalue of the second detection signal does not match with an eigenvalue used to infer the matching function MF, a distribution value may be obtained by a deduced from graph of matching function MF, e.g., shown in FIG. 14.

FIGS. 15A, 15B, 16A and 16B are graphs illustrating an effect of an optical measuring method according to an example embodiment.

Figure 15A:
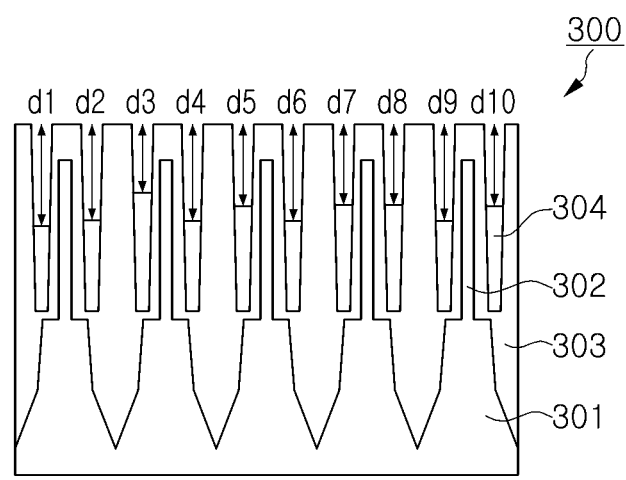
FIGS. 15A, 15B, 16A and 16B are graphs illustrating an effect of an optical measuring method according to an example embodiment.
Figure 15B:
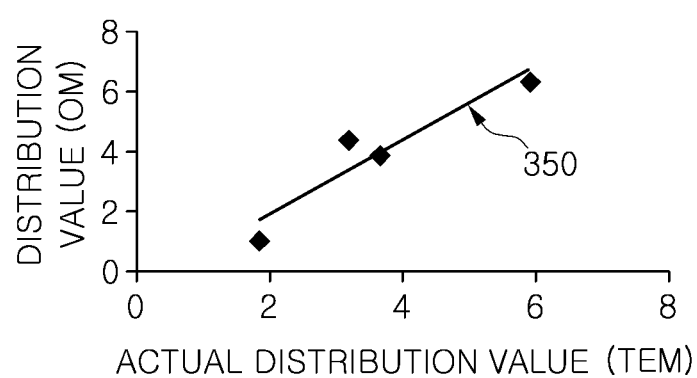

With reference to FIG. 15A, a wafer 300 may include a substrate 301, first patterns 302 formed from the substrate 301, second patterns 303 formed on the first patterns 302, and third patterns 304 filling a space between the second patterns 303. FIG. 15B may be a graph comparing distribution values in which the horizontal axis represents distribution values of depths d1 to d10 from an upper surface of second patterns 303 to an upper surface of third patterns 304 which are calculated by a measuring method using a transmission electron microscope (TEM) and the vertical axis represents distribution values of depths d1 to d10 from the upper surface of the second patterns 303 to the upper surface of the third patterns 304 which are calculated by an optical measuring method (OM) according to an example embodiment. With reference to a graph of FIG. 15B, distribution values are illustrated with respect to four wafers having different profiles, in which the distribution values of the depths d1 to d10 calculated using the optical measuring method according to an example embodiment and the distribution values measured using the TEM.

With reference to FIG. 15B, the vertical axis denotes the distribution value of the depths d1 to d10 measured using the optical measuring method (OM) according to an example embodiment, while the horizontal axis denotes the distribution value of the depths d1 to d10 measured using the TEM. As illustrated in FIG. 15B, it was verified that the distribution value measured using the TEM and the distribution value measured using the optical measuring method (OM) according to an example embodiment of the present disclosure have a specific correlation and do not represent a relatively large error. For example, FIG. 15B shows that the distribution value measured by a TEM and the distribution value measured by an optical measuring method of the present disclosure are substantially the same.

Figure 16A:
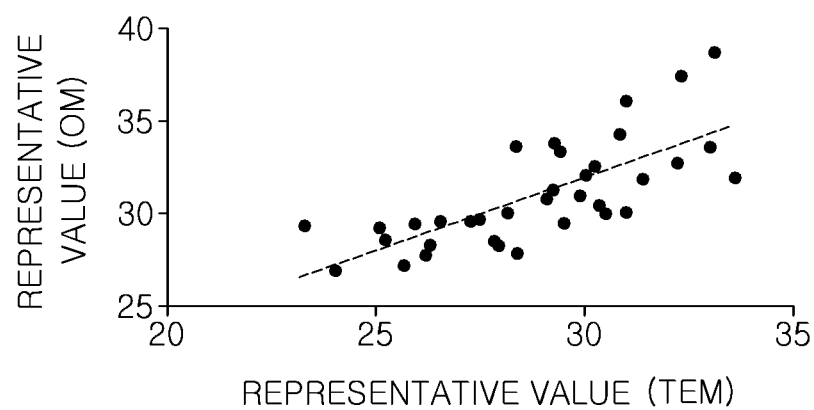
Figure 16B:
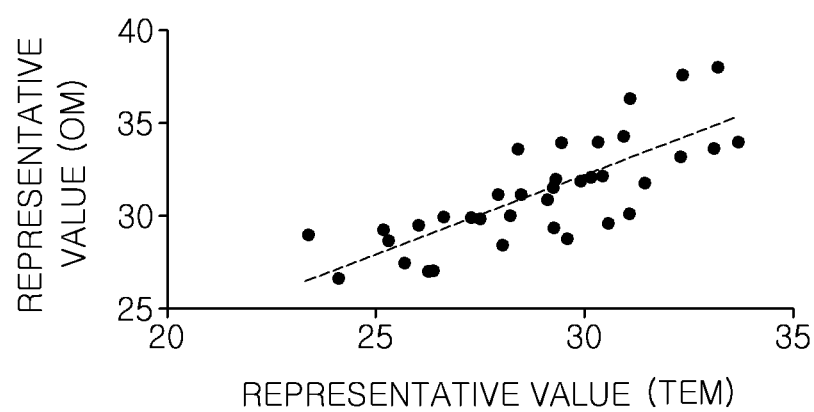

FIGS. 16A and 16B are graphs comparing representative values of dimensional parameters measured using the optical measuring method (OM) according to an example embodiment and another measuring method, such as the TEM. FIG. 16A may correspond to a case in which a representative value of dimensional parameters is measured without a process of filtering a raw light signal. FIG. 16B may correspond to a case in which, after a first detection signal is detected from a low frequency band by filtering the raw light signal as illustrated in example embodiments, a representative value of dimensional parameters is measured from the first detection signal.

In an example embodiment of FIG. 16A, a coefficient of determination ($R^2$) may be determined to be about 0.5373, while, in an example embodiment illustrated in FIG. 16b, the coefficient of determination ($R^2$) may be determined to be about 0.6115. For example, as illustrated in example embodiments, the dimensional parameters may be measured more accurately by applying the process of filtering in which a high frequency component and an intermediate frequency component are removed from the raw light signal. Thus, the profile of the plurality of patterns formed on a wafer may be accurately predicted using the optical measuring method according to example embodiments.

Figure 17:
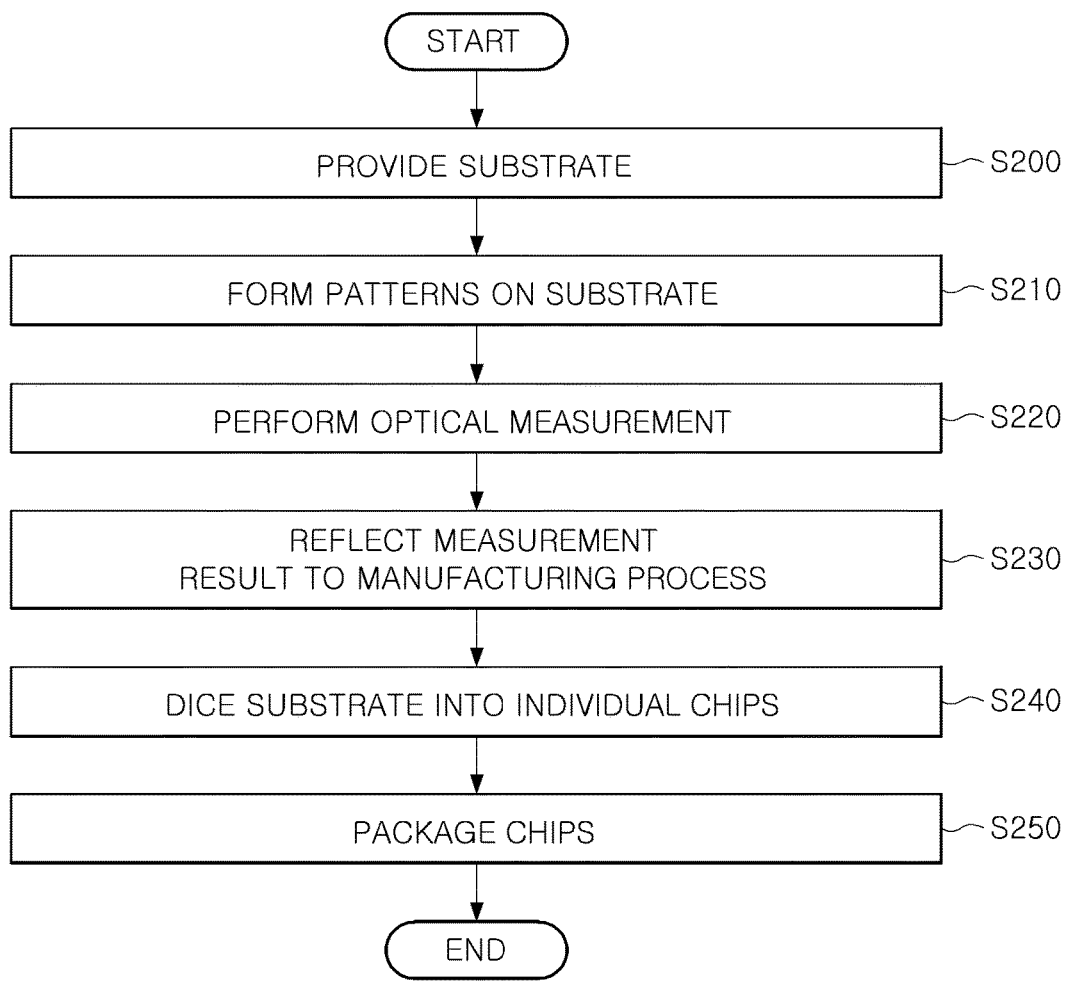
FIG. 17 is a flowchart showing a method of manufacturing a semiconductor device according to an embodiment of the present disclosure.

FIG. 17 is a flowchart showing a method of manufacturing a semiconductor device according to an embodiment of the present disclosure. Referring to FIG. 17, a substrate may be provided on a stage supporting the substrate in S200, and then a pattern may be formed on the substrate in S210. The substrate may be a semiconductor substrate (e.g., a silicon substrate, a germanium substrate, etc.) or an insulator substrate. The pattern may be formed with the substrate itself (e.g., a semiconductor substrate) or may be formed with a layer coated/deposited on the substrate. The pattern may be a conductor pattern, a semiconductor pattern or an insulator pattern. In some embodiments, the pattern may form a portion of an integrated circuit (IC) formed on the substrate. In certain embodiments, the pattern may be an interim/sacrificial pattern (e.g., a photoresist pattern/mask pattern) which is used for forming a portion of an integrated circuit on the substrate. After forming the pattern on the substrate in S210, the pattern may be measured by an optical measuring method according to an embodiment of the present disclosure in S220. With the result of the optical measurement, the pattern may be determined to be pass/fail to be proceeded to the next process in S230. In certain embodiments, the result of the optical measurement may be used as feedback information for the following substrates to be processed and/or whether a process forming the pattern needs to be modified. After applying the feedback information to the process and/or the pattern formed on the substrate satisfies a predetermined specification (e.g., pass), an integrated circuit may be completed with or without additional manufacturing process. For example, the predetermined specification may include predetermined ranges of a representative value and a distribution value of a profile of plurality of patterns. Then, the substrate may be divided into individual IC chips in S240. The manufacturing process may be followed by a packaging process of the indivicual IC chips in S250. For example, the packaging process may use chip stack/package stack technology. In certain embodiments, the packaging process may use package-on-package technology in packaging the IC chips in S250.

As set forth above, according to example embodiments of the present inventive concept, after an optical signal obtained by detecting light reflected by a plurality of patterns formed on a semiconductor wafer may be converted into a frequency domain, a representative value representing a profile of a plurality of patterns based on a signal component of a first frequency band may be calculated, and a distribution value representing a profile of a plurality of patterns based on a signal component of a second frequency band may be calculated. Therefore, while a specimen is not destroyed, a representative value and a distribution value of at least one of dimensional parameters determining a profile of a plurality of patterns may be quickly measured, and a determination may be made as to whether a semiconductor manufacturing process for forming the plurality of patterns has been appropriately performed.

While example embodiments have been shown and described above, it will be apparent to those skilled in the art that modifications and variations could be made without departing from the scope of the present inventive concept as defined by the appended claims.

What is claimed is:

1. A method of manufacturing a semiconductor device, the method comprising:
   obtaining a raw light signal by selecting a predetermined wavelength band of light reflected from a wafer on which a plurality of patterns are formed;
   converting the raw light signal into a frequency domain;
   obtaining a first detection signal having a first frequency band from the raw light signal converted into the frequency domain;
   obtaining a second detection signal having a second frequency band from the raw light signal converted into the frequency domain, the second frequency band being different from the first frequency band;
   obtaining a representative value using the first detection signal, the representative value representing a profile of the plurality of patterns;
   obtaining a distribution value using the second detection signal, the distribution value representing a profile of the plurality of patterns using the second detection signal;
   determining whether the representative value and the distribution value are within predetermined ranges respectively; and
   performing a following step of manufacturing the semiconductor device when the representative value and the distribution value are within respective predetermined ranges.

2. The method of claim 1, wherein the second frequency band is higher than the first frequency band, and
   wherein the following step is a layer deposition step, a dicing step or a packaging step.

3. The method of claim 2, further comprising:
   filtering a third frequency band having higher frequencies than the second frequency band from the raw light signal converted into the frequency domain,
   wherein the first detection signal and the second detection signal are obtained from the raw light signal converted into the frequency domain after the third frequency band is filtered.

4. The method of claim 1, wherein the first detection signal and the second detection signal are obtained using at least one of a moving average filter and a fast Fourier transform (FFT) filter.

5. The method of claim 1, wherein the first detection signal is converted into a wavelength domain to calculate the representative value.

6. The method of claim 5, wherein a predetermined modeling technique is applied to the first detection signal converted into a wavelength domain to calculate the representative value.

7. The method of claim 1, further comprising:
   generating first simulation signals by selecting the predetermined wavelength band of light reflected from each of a plurality of sample regions including a plurality of sample patterns having different profiles;
   obtaining second simulation signals by converting the first simulation signals into the frequency domain and selecting the second frequency band from the first simulation signals converted into the frequency domain; and generating a matching function defining a relationship between eigenvalues of the second simulation signals and actual distribution values of dimensional parameters of sample patterns determining the profiles of the sample patterns of the plurality of sample regions.

8. The method of claim 7, further comprising:
calculating an eigenvalue of the second detection signal; and
determining the distribution value of the plurality of patterns using the eigenvalue of the second detection signal and the matching function.

9. The method of claim 8, further comprising:
determining an offset value and a slope from the matching function, the offset value and the slope defining a relationship between the eigenvalues of the second simulation signals and the actual distribution values of the sample patterns; and
calculating the distribution value of the plurality of patterns using the eigenvalue of the second detection signal, the offset value, and the slope.

10. The method of claim 1, wherein the representative value is a median value or an average value of one of dimensional parameters of the plurality of patterns determining the profile, and the distribution value is a variance or a standard deviation of one of the dimensional parameters.

11. The method of claim 1, wherein the raw light signal is obtained from at least one of a reflectance spectrum and a phase difference spectrum according to a wavelength of light reflected from the wafer.

12. The method of claim 1, wherein the representative value is a median value or an average value of at least one of a width, a length, and a height of the plurality of patterns and an interval between the plurality of patterns, and
the distribution value is a variance or a standard deviation of at least one of the width, the length, and the height of the plurality of patterns and the interval between the plurality of patterns.

13. The method of claim 1, wherein the raw light signal is generated from light reflected from the wafer using a spectroscopic ellipsometer (SE).

14. A method of manufacturing a semiconductor device, the method comprising:
obtaining a raw light signal defined in a frequency domain using light reflected from a measurement region including a plurality of patterns;
dividing the raw light signal into a first detection signal having a first frequency band, a second detection signal having a second frequency band, and a third detection signal having a third frequency band;
obtaining a representative value representing a profile of the plurality of patterns by converting the first detection signal into a wavelength domain; and
obtaining a distribution value representing a profile of the plurality of patterns by inserting a value of the second detection signal into a matching function provided in advance;
determining whether the representative value and the distribution value are within predetermined ranges respectively; and
performing a following step of manufacturing the semiconductor device when the representative value and the distribution value are within respective predetermined ranges.

15. The method of claim 14, wherein the profile is determined by dimensional parameters including at least one of a width, a height, and a length of the plurality of patterns and an interval between the plurality of patterns.

16. The method of claim 14, wherein the representative value is a median value or an average value of at least one of dimensional parameters of the plurality of patterns determining the profile, and the distribution value is a variance or a standard deviation of at least one of the dimensional parameters.

17. The method of claim 14, wherein the matching function is a function defining a relationship between distribution values of dimensional parameters determining a profile of a plurality of sample patterns included in each of a plurality of sample regions and eigenvalues of a plurality of simulation signals obtained from the plurality of sample regions.

18. The method of claim 14, wherein the first frequency band is lower than the second frequency band, and the second frequency band is lower than the third frequency band.

19. The method of claim 18, wherein the third detection signal is determined to be a noise component.

20. A method of manufacturing a semiconductor device, the method comprising:
generating first simulation signals by selecting a predetermined wavelength band of light reflected from each of a plurality of sample regions, each of the plurality of sample regions including a plurality of sample patterns;
obtaining second simulation signals by converting the first simulation signals into a frequency domain and selecting a predetermined frequency band;
generating a matching function defining a relationship between root mean square values of the second simulation signals and distribution values of dimensional parameters determining profiles of the plurality of sample patterns;
generating a raw light signal by selecting the wavelength band from light reflected from a measurement region including a plurality of patterns;
obtaining a detection signal by converting the raw light signal into a frequency domain and selecting the predetermined frequency band;
obtaining a distribution value of a dimensional parameters determining profiles of the plurality of patterns by inserting a root mean square value of the detection signal into the matching function;
determining whether the distribution value is within a predetermined range; and
performing a following step of manufacturing the semiconductor device when the distribution value is within a predetermined range,
wherein the following step is a layer deposition step or a dicing step.

* * * * *